US008310230B2

(12) United States Patent
Haensch et al.

(10) Patent No.: US 8,310,230 B2
(45) Date of Patent: Nov. 13, 2012

(54) METHOD AND DEVICE FOR SENSING MICROWAVE MAGNETIC FIELD POLARIZATION COMPONENTS

(75) Inventors: Theodor W. Haensch, München (DE); Pascal Boehi, München (DE); Max Riedel, München (DE); Philipp Treutlein, München (DE)

(73) Assignees: Max-Planck-Gesellschaft zur Forderung der Wissenschaften e.V. (DE); Ludwig-Maximillians-Universitat Munchen (DE)

( * ) Notice: Subject to any disclaimer, the term of this patent is extended or adjusted under 35 U.S.C. 154(b) by 219 days.

(21) Appl. No.: 12/729,812

(22) Filed: Mar. 23, 2010

(65) Prior Publication Data

US 2011/0234219 A1    Sep. 29, 2011

(51) Int. Cl.
*G01R 33/02* (2006.01)
*G01N 27/72* (2006.01)

(52) U.S. Cl. ........................................ 324/260; 324/228
(58) Field of Classification Search .................. None
See application file for complete search history.

(56) References Cited

U.S. PATENT DOCUMENTS

| | | | | |
|---|---|---|---|---|
| 5,451,863 A | * | 9/1995 | Freeman | 324/96 |
| 7,277,636 B1 | * | 10/2007 | Gazdzinski | 398/53 |
| 2010/0177317 A1 | * | 7/2010 | Schwartz et al. | 356/460 |

FOREIGN PATENT DOCUMENTS

DE    10 2005 023 937 A1    11/2006

OTHER PUBLICATIONS

Black, R.C. et al., "Imaging Radio-Frequency Fields Using a Scanning SQUID Microscope," *Applied Physics Letters*, Mar. 6, 1995, vol. 66, No. 10, pp. 1267-1269.

Böhi, P. et al., "Coherent Manipulation of Bose-Einstein Condensates with State-Dependent Microwave Potentials on an Atom Chip," *Nature Physics*, Aug. 2009, vol. 5, pp. 592-597.

Böhm, C. et al., "Contactless Electrical Characterization of MMICs by Device Internal Electrical Sampling Scanning-Force-Microscopy," *IEEE MTT-S Digest*, 1994, pp. 1605-1608.

Böhm, C. et al., "Rapid Communication: Voltage Contrast in Integrated Circuits with 100 nm Spatial Resolution by Scanning Force Microscopy," *J. Phys. D. Appl. Phys.*, 1993, vol. 26, pp. 1801-1805.

(Continued)

*Primary Examiner* — Vinh Nguyen
(74) *Attorney, Agent, or Firm* — DLA Piper LLP (US)

(57) ABSTRACT

A method for sensing a microwave magnetic field polarization component of a microwave field generated by a microwave device, comprises the steps of generating a static magnetic field having a predetermined amplitude and a predetermined direction relative to the microwave magnetic field polarization component to be sensed, preparing an atom cloud of ultracold probe atoms in defined hyperfine levels, wherein the hyperfine levels of the probe atoms are split in transition frequencies by the static magnetic field, applying a microwave pulse including the microwave magnetic field polarization component to be sensed to the atom cloud, wherein a spatial state distribution of the probe atoms is created by Rabi oscillations during the microwave pulse between the hyperfine levels of the probe atoms being resonant with the microwave magnetic field polarization component, and collecting a state image of the probe atoms, said state image depending on the spatial state distribution of the probe atoms and representing the magnetic field polarization component to be sensed. Furthermore, a sensor device being adapted for sensing a microwave field created by a microwave device is described.

20 Claims, 5 Drawing Sheets

OTHER PUBLICATIONS

Bücker, R. et al., "Single-Atom-Sensitive Fluorescence Imaging of Ultracold Quantum Gases," *arXiv 0907.0674v1*, Jul. 3, 2009, pp. 1-23.

Budka, T.P. et al., "A Coaxial 0.5-18 GHz Near Electric Field Measurement System for Planar Microwave Circuits Using Integrated Probes," *IEEE Transactions on Microwave Theory and Techniques*, Dec. 1996, vol. 44, No. 12, pp. 2174-2184.

Chu, S., "Cold Atoms and Quantum Control," *Nature*, Mar. 2002, vol. 416, pp. 205-246.

David, G. et al., "Electro-Optic Probing of RF Signals in Submicrometre MMIC Devices," *Electronics Letters*, Dec. 7, 1995, vol. 31, No. 25, pp. 2188-2189.

Dicarlo, L. et al., "Demonstration of Two-Qubit Algorithms with a Superconducting Quantum Processor," *Nature*, Jul. 9, 2009, vol. 460, pp. 240-244.

Dubois, T. et al., "Near-Field Electromagnetic Characterization and Pertubation of Logic Circuits," *IEEE Transactions on Instrumentation and Measurement*, Nov. 2008, vol. 57, No. 11, pp. 2398-2404.

Dutta, S.K. et al., "Imaging Microwave Electric Fields Using a Near-Field Scanning Microwave Microscope," *Applied Physics Letters*, Jan. 4, 1999, vol. 74, No. 1, pp. 156-158.

Farkas, D.M. et al., "A Compact, Transportable, Microchip-Based System for High Repeition Rate Production of Bose-Einstein Condensates," *arXiv :0912.0553*, Dec. 2009, pp. 1-3.

Gao, T. et al., "Miniature Electric Near-Field Probes for Measuring 3-D Fields in Planar Microwave Circuits," *IEEE Transactions on Microwave Theory and Techniques*, Jul. 1998, vol. 46, No. 7, pp. 907-913.

Gao, Y at al., "A Miniature Magnetic Field Probe for Measuring Fields in Planar High-Frequency Circuits," *IEEE MTT-S Digest*, vol. 2, pp. 1159-1162, 1995.

Gentile, T.R. et al., "Experimental Study of One- and Two-Photon Rabi Oscillations," *Physicai Review A*, Nov. 1, 1989, vol. 40, No. 9, pp. 5103-5115.

Matthews, M.R. et al., Dynamical Response of a Bose-Einstein Condensate to a Discontinuous Change in Internal State, *Physical Review Letters*, Jul. 13, 1998, vol. 81, No. 2, pp. 243-247.

Sayil, S. et al., "A Survey of Contactless Measurement and Testing Techniques," *EEE Potentials*, Feb./Mar. 2005, vol. 24, pp. 25-28.

Steck, H. et al., "Output of a Pulsed Atom Laser," *Physical Review Letters*, Jan. 5, 1998, vol. 80, No. 1, pp. 1-5.

\* cited by examiner

METHOD AND DEVICE FOR SENSING MICROWAVE MAGNETIC FIELD POLARIZATION COMPONENTS

TECHNICAL FIELD

The present invention relates to a method for sensing at least one microwave (mw) magnetic field polarization component of a mw field generated by a mw device, like e.g. a method for sensing a spatial distribution of mw magnetic field polarization components of a mw device under examination. Furthermore, the present invention relates to a sensor device being configured for conducting the above method. Applications of the invention are available in the fields of examining and engineering mw devices, like e.g. monolithic mw integrated circuits (MMICs/RFICs), electronic mw components high-frequency circuits or mw antenna devices.

TECHNICAL BACKGROUND

Monolithic Microwave Integrated Circuits (MMICs) are of great importance in science and technology. MMICs constitute key building blocks of communication technology. Furthermore they have recently been used as a key component of superconducting quantum processors (see e. g. L. DiCarlo, et al. in "Nature" vol. 460, 2009, p. 240-244). Function and failure analysis of such MMICs is of crucial importance for the design as well as for simulation verification and diagnostics (see C. Böhm et al. in "Microwave Symposium Digest IEEE MTT-S International", San Diego, 1994, p. 1605-1608).

Knowledge of external port measurements (e.g. using a network analyzer) offers only limited insight. For error analysis the mw near-field distribution on the device gives much more insight and allows spatially resolved testing and improvement based upon experimental results. Therefore different methods have been developed to study the spatial distribution of the mw near-fields (see e. g. S. Sayil et al. in "IEEE Potentials" vol. 24, 2005, p. 25-28; S. K. Dutta et al. in "Appl. Phys. Lett." vol. 74, 1999, p. 156-158; C. Böhm et al. in "J. Phys. D.: Appl. Phys." vol. 26, 1993, p. 1801-1805; Y. Gao et al. in "IEEE Trans on Microwave Theory and Techniques" vol. 46, 1998, p. 907-913; Y. Gao et al. in "Microwave Symposium Digest, IEEE MTT-S International" vol. 3, 1995, p. 1159-1162; G. David et al. in "Electronic Letters" vol. 31, 1995, p. 2188-2189; T. Dubois et al. in "IEEE Trans on Instrumentation and Measurement" vol. 57, 2008, p. 2398-2404; T. Budka et al. in "IEEE Trans. on Microwave Theory and Techniques" vol. 44, 1996, p. 2174-2184; and R. C. Black et al. in "Appl. Phys. Lett." vol. 66, 1995, p. 1267-1269).

These methods use diverse physical effects to measure the mw electric or magnetic field. They have in common that they scan the field distribution point-by-point by complex and time consuming measurement techniques A simple MMIC structure has recently been used as a tool for quantum coherent manipulation of ultracold atoms on atom chips (see P. Böhi et al. in "Nature Physics" vol. 5, 2009, p. 592-597). The ultracold atoms are moved, depending on their hyperfine state, by the influence of mw near-field potentials created with the MMIC structure. However, a method of measuring the mw near-field has not been described by P. Böhi et al.

Ultracold atoms forming a Bose-Einstein condensate (BEC) have been used for measuring an external magnetic potential (DE 10 2005 023 937 A1). The BEC is confined in a magnetic trap, which is subjected to a superposition with the external potential to be measured. As a result, the spatial distribution (atom density) of the BEC is changed, which can be optically imaged.

OBJECTIVE OF THE INVENTION

The objective of the invention is to provide an improved method for non-invasive, polarization selective sensing at least one mw magnetic field polarization component of a mw field, avoiding the limitations of conventional techniques for measuring mw fields. In particular, it is the objective of the invention to provide an improved mw field sensing method, which is capable of sensing individual magnetic field components of microwave fields with a non-invasive measurement technique, offering a complete reconstruction (amplitudes and phases) of the distribution of the high frequency magnetic field. Furthermore, the objective of the invention is to provide an improved sensor device for sensing a mw magnetic field polarization component of a mw field, which is capable of avoiding disadvantages and limitations of conventional techniques.

The above objectives are achieved with methods or devices comprising the features of independent patent claims. Advantageous embodiments and applications of the invention are defined in the dependent claims.

SUMMARY OF THE INVENTION

According to a first general aspect of the invention, the above objective is solved by a method for sensing at least one mw magnetic field polarization component of a mw field, which comprises the following steps. According to the invention, an atom cloud of ultracold probe atoms is prepared and subjected to a static magnetic field, which has a predetermined amplitude and direction relative to the mw magnetic field polarization component to be sensed. The ultracold probe atoms comprise thermal atoms or atoms forming a Bose-Einstein condensate. They have a temperature below 100 µK, preferably below 5 µK. The ultracold probe atoms populate defined hyperfine levels, which are split in transition frequencies by the static magnetic field due to the Zeeman effect. This splitting leads to a resonance condition which is different for the different mw magnetic field polarization components. Furthermore, according to the invention, a mw pulse (preparation pulse) including the at least one mw magnetic field polarization component to be measured is applied to the atom cloud. The presence of the at least one resonant mw magnetic field component causes Rabi oscillations (see T. R. Gentile et al. in "Phys. Rev. A" vol. 40, 1989, S.5103-5115) between the resonant hyperfine levels. The Rabi oscillations change the population of the atomic hyperfine states. As the Rabi oscillations occur only with those atomic hyperfine states, which are resonant with the at least one mw magnetic field polarization component, a certain portion of the probe atoms may be kept unchanged, while other probe atoms oscillate between the different hyperfine states during the mw pulse, and are therefore after the pulse partly transferred to another state. As a result, a spatial state distribution of the probe atoms is modulated due to the spatial distribution of Rabi oscillation frequencies, which are locally generated by the at least one mw magnetic field polarization component to be sensed.

Furthermore, according to the invention, an image of the probe atoms is collected. An interaction of the probe atoms with an imaging radiation, preferably an optical imaging radiation, is specifically influenced by the spatial hyperfine state distribution of the probe atoms. Therefore, the image of the probe atoms (in the following: state image) is representing the local effect of the at least one magnetic field polarization component, which can be extracted from the state image. The state image is an image representing the population of the hyperfine level states of the probe atoms and/or an image representing a state-selective motion of the probe atoms as outlined with further details below.

According to a second general aspect of the invention, the above objective is solved by a sensor device, which is adapted for conducting the mw field sensing method according to the above first aspect. According to the invention, the sensor device comprises a vacuum chamber providing an environment of reduced pressure and accommodating probe atoms, which are used for sensing the mw field. Furthermore, the inventive sensor device comprises an atom cloud preparation device, which is adapted for preparing an atom cloud of ultracold probe atoms in defined hyperfine levels. To this end, the atom cloud preparation device includes a cooling device for cooling the probe atoms and a magnetic field device, which is adapted for creating a static magnetic field. Furthermore, the atom cloud preparation device includes a device for preparing the atoms in a defined hyperfine state. In operation, the hyperfine levels of the probe atoms are split in transition frequencies by the static magnetic field.

Furthermore, the inventive sensor device comprises a control device, which is arranged for applying a mw pulse of the mw field to be sensed to the atom cloud. The control device is capable of driving the mw device for generating the mw field such that the mw pulse is created.

Furthermore, the inventive sensor device comprises an imaging device, which is arranged for collecting an image of the atom cloud, which depends on a spatial state distribution of the probe atoms and represents the at least one magnetic field polarization component to be sensed. Preferably, the imaging device is configured for state-selective absorption imaging as described by M. R. Matthews et al. in "Phys. Rev. Lett." (vol. 81, 1998, p. 243-247). As alternatives, fluorescence imaging or other conventional state-selective imaging techniques can be used.

The mw field sensing method and the sensor device according to the invention have the following advantages. The invention allows a non-invasive, highly parallel, complete (amplitudes and phases) measurement and reconstruction of the mw magnetic field distribution using clouds of ultracold atoms. In particular, the non-invasive mw magnetic field measurement method presented here is highly parallel in the sense that it does not rely on a point-by-point scanning. The presence of a mw field polarization component, which is resonant with the at least two atomic hyperfine levels, causes Rabi oscillations between the at least two hyperfine levels, which leads to a characteristic atom number distribution within the resonant hyperfine levels, that depends on the at least one resonant mw magnetic field polarization component. This distribution can be detected using state-selective imaging, e.g. absorption imaging. As the state image depends on the spatial atom number population within the hyperfine level structure of the probe atoms, the inventive sensing method is capable of sensing individual polarization components of alternating mw magnetic fields. It is possible to tune the mw frequency to which the atoms are sensitive by more than 10 GHz. It is therefore possible to measure the individual mw magnetic field polarization components distribution of a multi-tone signal frequency selectively. This represents an essential advantage compared with the technique described in DE 10 2005 023 937 A1.

The inventive method, in contrast to DE 10 2005 023 937 A1, works by measuring the hyperfine state distribution of the atoms. The hyperfine state distribution is changed in a characteristic way by the presence of a resonant high-frequency field, like e.g. a mw field. This allows a direct measurement of individual polarization components and their phases. Such a measurement is impossible with the conventional technique mentioned above.

The invention offers µm spatial resolution and a mw magnetic field sensitivity of order $10^{-8}$ T or better at frequencies of a few GHz. In particular, it provides a tuneable, single-shot technique to measure a 2D mw magnetic field distribution. The method can be extended to measure 3D distributions slice by slice. Data extraction from the collected state image(s) is simple and it offers a high dynamical range. Furthermore the method is intrinsically calibrated since only well-known atomic properties enter in the data analysis.

In particular, the inventive cold atoms field imaging method is promising for applications like prototype characterization. It allows for highly sensitive, relatively quick, polarization resolved high-resolution determination of the mw magnetic field distribution in free space around an MMIC. The field around the MMIC can be fully reconstructed. Cold atoms are relatively easy to prepare, key components are commercially available, and since it is not necessary to get a BEC, vacuum requirements are relatively easy. A short-cycle locking vacuum system with a pressure of $10^{-9}$ mbar, like used for UHV evaporation, is already good enough. Also the time it takes for one shot (14 s in our case) can be lowered by at least a factor of 5 in a setup optimized for that purpose (see D. M. Farkas et al. in "arXiv:0912.0553", 2009).

As a further advantage, various different sensing techniques can be implemented depending on the application of the invention. As an example, it may be sufficient to sense one single mw magnetic field polarization component only, i.e. only one vector component of the mw field generated by a mw device under examination. The mw magnetic field polarization component may be measured at one single restricted location or as a 2D or 3D field distribution. Accordingly, various preferred embodiments of the invention can be implemented as summarized in the following.

With a first embodiment of the invention, a spatial distribution of the at least one mw magnetic field polarization component is sensed. In this case, the atom cloud preparation device is configured for distributing the probe atoms by at least one of a thermal and a mean-field repulsion expansion of the atom cloud. Preferably, the expansion of the atom cloud is obtained by opening an atom trap accommodating the probe atoms in at least one spatial direction. The atom cloud is released from the trap prior to applying the mw pulse. With this first embodiment, the state image represents the distribution of the polarization component in the space covered by the expanded atom cloud.

According to a preferred variant, the space covered by the expanded atom cloud is adjusted by applying the mw pulse with a predetermined delay time after opening the atom trap. Accordingly, the cloud is given a certain time to expand after releasing the atoms from the trap, prior to applying the mw pulse.

According to a further modification, the space covered by the expanded atom cloud can be shaped in the spatial hyperfine state distribution or in a spatial atom number distribution. Advantageously, this allows an adaptation of the atom cloud to the shape of the mw field to be sensed. Shaping of the cloud of probe atoms can be implemented e.g. by using at least one light pulse prior and/or after applying the mw magnetic field polarization component.

Additionally or alternatively, an anisotropic expansion of the atom cloud can be provided for an adaptation of the atom cloud to the mw field to be sensed. To this end, the atom trap can be formed with an anisotropic shape as such, or the atom trap can be subjected to an anisotropic adjustment. Furthermore, the cloud's mean-field expansion can be adjusted by changing the interaction strength between the atoms, e.g. by using a so-called Feshbach resonance.

With a further preferred modification of the first embodiment, a plurality of state images can be collected sequentially. The position of the cloud and/or the mw pulse parameters are sequentially changed so that the steps of preparing the atom cloud, applying the mw pulse and collecting the state image are repeated with changing conditions. As a preferred example, the atom cloud and the mw device can be moved relative to each other for collecting the plurality of state images.

According to a second embodiment of the invention, the resonance condition for the probe atoms of the atom cloud is confined to a spatially restricted region of investigation (ROI). Advantageously, multiple variants are available for confining the resonance condition into the spatially restricted ROI. According to a first variant, at least one of a magnetic field gradient of the static magnetic field and an external optical field can be used for adjusting the hyperfine levels such that they are resonant with the mw magnetic field polarization component to be sensed in the restricted ROI only. To this end, the atom cloud preparation device includes an adjustment device being adapted for a local adjustment of resonance conditions corresponding to a particular polarization component.

As an example, the static magnetic field is generated with a predetermined amplitude gradient such that the atomic hyperfine levels of the probe atoms are resonant in transition frequencies by the static magnetic fields in a restricted layer portion only. By a further shaping of the static magnetic field, the ROI can be restricted to a line- or dot-shaped portion. Furthermore this can be combined with a shaping of the atom cloud, either in internal state or in the spatial atom number distribution using at least one optical pulse.

With a second, preferred variant, the probe atoms can be confined using an atom trap. In this case, the atom cloud preparation device includes an atom trap device. Any type of atom trap can be used for trapping and/or shaping the cloud of probe atoms as it is conventionally known from manipulating ultracold atoms, e.g. a magnetic trap and/or an optical trap. Furthermore, multiple traps, created e.g. with an array of magnetic traps or an optical lattice can be used as outlined below. The atom trap is positioned relative to the mw device and shaped such that the probe atoms are located within the ROI only. Spatially trapping the atoms in an atom trap may have advantages in terms of the availability of multiple techniques for adjusting and controlling atom traps as well as reachable mw magnetic field sensitivity.

With a further variant, confining using spatially restricted adjusting the resonant hyperfine levels and trapping the atoms in an atom trap can be combined.

With the second variant of the second embodiment of the invention, collecting the state image of the probe atoms can be facilitated. If confining of the probe atoms is adjusted such that the application of the mw pulse results in a population of untapped hyperfine states, a certain portion of the atoms is capable of leaving the atom trap. Accordingly, collecting the state image may simply comprise measuring a fraction of atoms separated from the atom trap and/or a fraction of atoms remaining in the atom trap. It is to be noted that this state image also represents an image directly depending on the population of the resonant hyperfine level states and accordingly on the mw magnetic field polarization component. In other words, with this implementation of the second variant of the second embodiment, the state of the probe atoms is detected by measuring the loss of a fraction of atoms from the atom trap. According to a preferred implementation of this embodiment, only the total number of the atoms in different states is determined, which is characterized by the integrated atom and mw magnetic field polarization component over the extent of the trapped cloud. Alternatively, only the total fraction of the lost and/or remaining atoms can be determined, which is characterized by the integrated amplitude of the mw magnetic field polarization component over the extent of the cloud. In all cases, the fraction of lost and/or remaining atoms in the trap represents a measure for the mw magnetic field polarization component spatially averaged over the extent of the trap.

With a further preferred modification of the second embodiment, a plurality of state images can be collected sequentially or simultaneously. In both cases, the ROIs and/or mw pulse parameters are sequentially changed so that the steps of preparing the atom cloud, applying the mw pulse and collecting the state image are repeated with changing conditions. As a preferred example, the atom cloud and the mw device can be moved relative to each other for collecting the plurality of state images. In the second case, multiple atom traps can be generated simultaneously, e.g. using an optical lattice. In this case, the mw magnetic field polarization component can be sensed at each location of one of the multiple atom traps.

Another advantage of the invention is based on the fact that multiple options are available for adapting the sensor device to the mw field polarization component to be measured. According to a first variant, the resonant hyperfine levels, and therefore the mw polarization component to be sensed, can be matched to a predetermined frequency of the mw field by adjusting the static magnetic field $B_0$. Thus, the inventive sensing method simply can be adapted to different frequency ranges and/or different mw devices. On the contrary, according to a second variant, the resonant hyperfine states at a predetermined static magnetic field can be matched by adjusting the mw frequency. Finally, the sensor device can be operated with probe atoms being selected in dependency on a frequency range of the mw field to be measured, see later.

According to a further embodiment of the invention, additional transition frequencies are available for an interaction of the mw pulse with the probe atoms if at least one additional mw or radio-frequency auxiliary field is applied to the probe atoms. Advantageously, with the auxiliary field, multi-photon Raman transitions can be driven. The auxiliary field may be free of intensity gradients, or it may have a predetermined (known) intensity distribution.

For testing a mw device, sensing one single mw magnetic field polarization component at one single location may be sufficient. Alternatively, if at least two multiple mw magnetic field polarization components are to be sensed, the at least one state image is collected with at least two different directions or values of the static magnetic field selected or at least two different mw frequencies in dependency on the polarization components to be sensed. For mapping the complete mw field, three different directions of the static magnetic field are adjusted, so that polarization components with all spatial directions can be sensed.

Depending on the application of the invention, different parameters of the mw field can be obtained from a reconstruction of the at least one state image. Firstly, amplitudes of the magnetic field components can be extracted from the at least one state image. The population of atomic states due to Rabi oscillations directly depends on the amplitude of the resonant mw magnetic field component. Secondly, relative phases of the mw magnetic field components can be extracted from the state images. Finally, for a complete mw field characterization, both of the amplitudes and the relative phases are analyzed. According to a further modification of the invention, even an absolute mw component phase distribution can be obtained using a Ramsey interferometer sensing sequence (see N. F. Ramsey, "Molecular Reams", Clarendon Press, Oxford, 1956). This is also suitable for measuring an off-resonant field like mw, radio-frequency or light fields.

Typically, the invention is used for testing mw devices or for investigating mw structures. As preferred examples, the mw device may comprise a MMIC/RFIC, mw components, a high-frequency circuit or an antenna device. The mw device can be arranged in the vacuum environment where the atom cloud is prepared and manipulated with the mw pulse. In this case, advantages in terms of a direct application of the mw field on the probe atoms are obtained. Alternatively, the mw device can be separated from the atom cloud. The mw device can be arranged in an environment of ambient or increased pressure, e.g. atmospheric pressure outside the vacuum device of the inventive sensor device. In this case, the measurement is facilitated as an introduction of the mw device into the vacuum device can be avoided. However, as the mw pulse is applied through a shielding window separating the vacuum environment and the environment of ambient pressure, the mw field can be modified by the material of the shielding window. Nevertheless, amplitude and/or relative phases of the magnetic field components can be reconstructed even with this embodiment using an image calibration.

BRIEF DESCRIPTION OF THE DRAWINGS

Further details and advantages of the invention are described in the following with reference to the attached drawings, which show in.

EMBODIMENTS OF THE INVENTION

Embodiments of the invention are described in the following with particular reference to the atom chip setup described by P. Böhi et al. in "Nature Physics" (vol. 5, 2009, p. 592-597). It is emphasized that it is not necessary to use the particular atom chip setup for implementing the inventive method. In particular, a standard, non-atom chip cold atoms setup can be used. Different types of mw devices can be tested inside (sec FIG. 7) or outside (see FIG. 8) of a vacuum chamber. Known details of preparing ultracold probe atoms in a vacuum environment and details of the probe atom imaging are not described here as they are known as such from prior art.

1. Microwave Field Sensing Method

Figure 1:
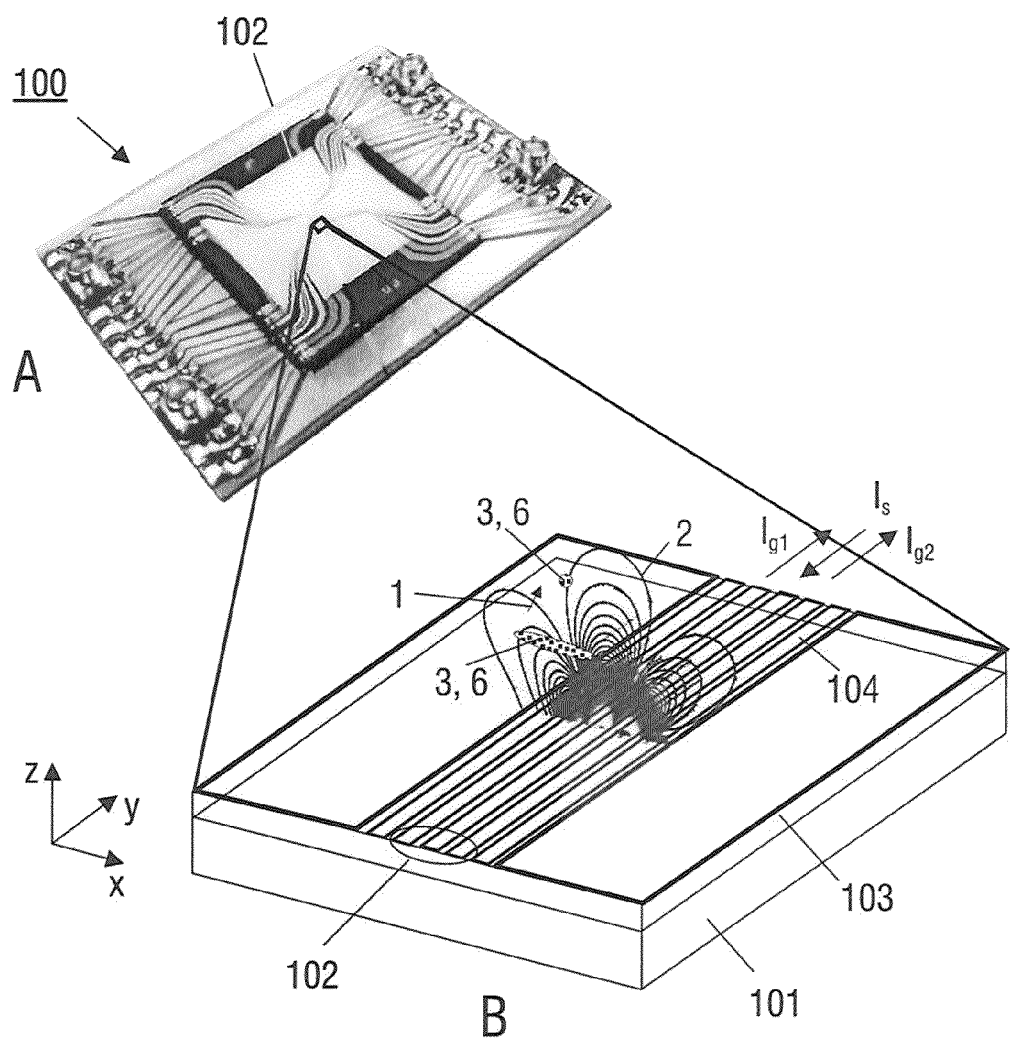
FIG. 1: a photographic representation of the mw device tested with the inventive method and an enlarged illustration of an exemplary mw field distribution to be sensed.

FIG. 1 illustrates the atom chip setup used for implementing the inventive mw field sensing method. FIG. 1A shows a photograph of the chip assembly including a mw chip 100 (MMIC 100), while FIG. 1B shows an enlarged schematic view of the waveguide structure and clouds of probe atoms. The mw chip 100 is made of a Si substrate 101 carrying a thin polyimide layer 103 and the mw coplanar waveguide (CPW) 102 with additional gold wires 104. The three central wires (cross-section 6 μm×1 μm each) form the mw CPW 102. An ideal CPW mode has mw current amplitudes $I_s=I_{mw}$ and $I_{g1}=I_{g2}=-I_{mw}/2$ resulting in a mw field 2 with the illustrated equipotential lines for the mw magnetic field component along the x axis (line spacing 60 mG for mw power $P_{mw}$=120 mW). Further details are described by P. Böhi et al. in "Nature Physics" (vol. 5, 2009, p. 592-597).

For sensing an exemplary mw magnetic field polarization component 2, a magnetically trapped atom cloud 3 of $^{87}$Rb probe atoms is prepared in a confined region of investigation 6 or in an extended region. For magnetically trapping, an atom trap device is provided (not shown in FIG. 1, see FIGS. 7, 8). For illustrative purposes, a dot-shaped atom cloud (diameter e. g. 3 μm) and a line shaped atom cloud (diameter e. g. 2 μm, length e. g. 15 μm) are shown.

1.1 Sensing a Microwave Magnetic Polarization Component Distribution (First Embodiment of the Invention)

Sensing a mw magnetic field polarization component distribution works as follows. Using the atom chip setup of FIG. 1, a cloud of $^{87}$Rb trapped in an atom trap is cooled to a temperature of T=5 μK, i.e. about a factor 4.5 above quantum degeneracy, using laser and evaporative cooling techniques (see S. Chu et al. in "Nature" vol. 416, p. 205-246, 2002). The magnetically trapped atoms are initially in the ground state hyperfine sublevel |F=1, $m_F$=−1>. The trap is moved close to the CPW structure 102 to be characterized, where it is switched off and the atoms are released to free fall. During a hold-off time $dr_{ho}$, the cloud drops due to gravity and expands due to its thermal velocity spread, filling the region to be imaged. Preferably, a delay time $dt_{ho}$ below 10 ms, in particular below 5 ms is selected.

Figure 2:
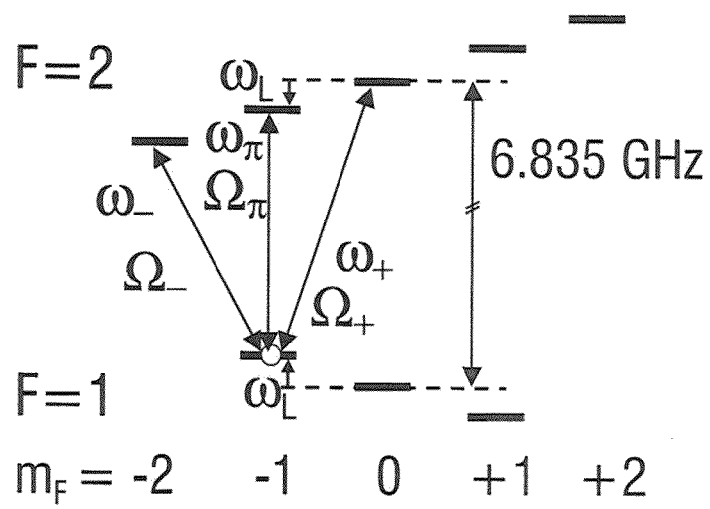
FIG. 2: a term scheme of $^{87}$Rb in a static magnetic field.

A homogeneous, static magnetic field $B_0$ is maintained. It provides the quantization axis and splits the frequencies $\omega_\gamma$ (γ=−,π or +) of the three hyperfine transitions |1,−1>→|2, $m_2$>, ($m_2$=−2,−1,0) by $$\omega_L = \frac{B_0 \mu_B}{2\hbar}$$

due to the Zeeman Effect. The term scheme of $^{87}$Rb in the static magnetic field $B_0$ is illustrated in FIG. 2. After $dt_{ho}$, a mw signal on the MMIC is subsequently switched on for a duration $dt_{mw}$ (typically some tens of μs). One of the transitions is selected by setting the mw frequency $\omega=\omega_\gamma$. The mw magnetic field $$\mathscr{B}(r,t) = \frac{1}{2}[B(r)e^{-i\omega t} + B^*(r)e^{i\omega t}]$$

couples to the atomic magnetic moment and drives Rabi oscillations of frequency $\Omega_\gamma$ on the resonant transition. For the three transitions of interest, $$\Omega_-(r) = -\sqrt{3}\frac{\mu_B}{\hbar}B_-(r)e^{-i\phi_-(r)}, \quad (1)$$

$$\Omega_\pi(r) = -\sqrt{\frac{3}{4}}\frac{\mu_B}{\hbar}B_\pi(r)e^{-i\phi_\pi(r)}, \quad (2)$$

$$\Omega_+(r) = \sqrt{\frac{1}{2}}\frac{\mu_B}{\hbar}B_+(r)e^{-i\phi_+(r)}. \quad (3)$$

$B_\pi$ is the (real-valued) amplitude of the mw magnetic field B projected onto $B_0$, $B_+$ ($B_-$) is the right (left) handed circular polarization component of B in the plane perpendicular to $B_0$ (see Supplementary Information below). If $\omega=\omega_\pi$ then $\Omega_\pi$ is proportional to the projection of B onto $B_0$. If $\omega=\omega_+(\omega_-)$ then $\Omega_+(\Omega_-)$ is proportional to the right (left) handed circular mw polarization component of B in the plane perpendicular to $B_0$. After the mw pulse, the probability $p_2(r)$ of an atom being detected in the F=2 hyperfine manifold is given by $$p_2(r) \equiv \frac{n_2(r)}{n_1(r)+n_2(r)} = \sin^2\left[\frac{1}{2}|\Omega_\gamma(r)|dt_{mw}\right]. \quad (4)$$

Here, $n_1(r)$ ($n_2(r)$) is the density of atoms in F=1 (F=2). The spatial distribution of atoms in the F=1 (F=2) manifold (see FIG. 3) is measured using state selective absorption imaging (see M. R. Matthews et al. in "Phys. Rev. Lett." vol. 81, 1998, p. 243-247). Absorption imaging integrates over the direction of propagation of the imaging laser beam. (see FIGS. 7, 8). Structures to be characterized should therefore have a characteristic length scale along the beam larger than the size of the atom cloud. The cloud size can be adjusted through the magnetic trap frequencies, T, and $dt_{ho}$.

Figure 3:
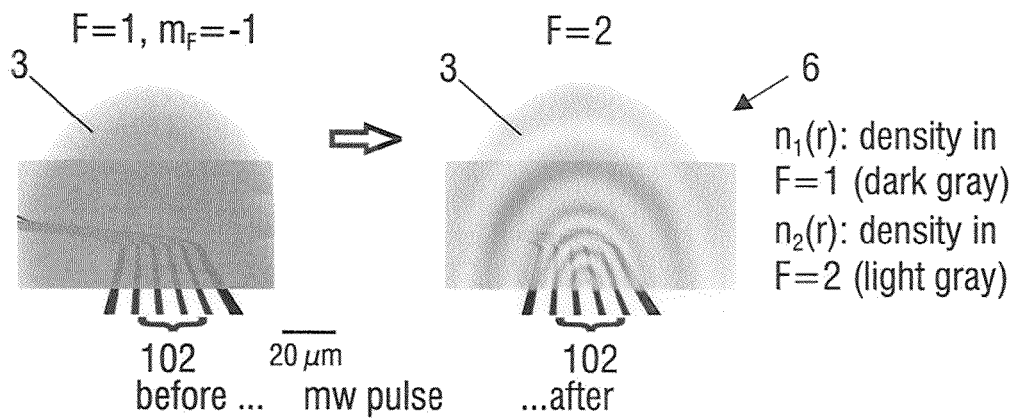
FIG. 3: a schematic illustration of changing a hyperfine state distribution of probe atoms by the influence of the at least one microwave magnetic field polarization components of a microwave pulse.

In FIG. 3, the left part shows the situation after the trap is switched off and the atom cloud 3 expands due to thermal motion during a time $dt_{ho}$. During application of a short mw pulse of duration $dt_{mw}$, resonant with one of the transitions $\omega_\gamma$ indicated in FIG. 2, Rabi oscillations are driven. The spatial population distribution in the manifolds F=1 and F=2 after the short mw pulse, as shown in the right part of FIG. 3, represents the intensity distribution of the resonant mw magnetic field component. This distribution is detected using the state-selective absorption imaging. From this distribution (state image 4), the mw magnetic field distribution is extracted. Details about the extraction procedure are given in section "Experimental results".

1.2 Sensing a Microwave Magnetic Polarization Component at One Single or Multiple Locations (Second Embodiment of the Invention)

For measuring the mw magnetic field on a small region of investigation, it is possible to hold a Bose-Einstein condensate (BEC) in a magnetic trap and optionally scan its position spatially from shot to shot. Such scanning can be done on a sub-μm length scale, and the trap position can be scanned in all three dimensions. A typical step size is given by twice the Thomas-Fermi radius $r_{TF}$ of the BEC in the trap. For example, for 1000 atoms in a trap with trap frequencies $f_x=f_y=f_z=500$ Hz the Thomas-Fermi radius is $r_{TF}=1.2$ μm. In this measurement configuration, Rabi oscillations are detected via imaging of the atom trap or the surrounding thereof. Thus, a loss of atoms from the atom trap can be detected, because $|2,m_2>$ with $m_2=-2,-1$ or 0 are magnetically non-trappable states.

By doing this, the mw magnetic field sensitivity is limited by atom loss not caused by the mw. If initially 1000 atoms in state $|1,-1>$ are prepared in a BEC, 500±16 atoms are lost during a trap holding time of 3 s due to three body recombination and background gas collisions. An additional loss of 20 atoms due to the mw can be recognized (at a signal-to-noise ratio>1), which is caused by a resonant mw magnetic field of $B_-=1.5\cdot10^{-10}$ T, $B_\pi=3\cdot10^{-10}$ T, and $B_+=3.7\cdot10^{-10}$ T.

If instead of a magnetic trap, a far-detuned crossed optical dipole trap is used (with the same trap frequencies of 500 Hz each), the sensitivity can be increased further. This increase is due to the fact that all hyperfine states are trapped, therefore a transfer of 10 atoms into F=2 is easily detectable using state imaging. Secondly, not only a fraction $\propto\Omega/\mu_c$ of the atoms in the trap are coupled by the mw magnetic field, as it is the case for magnetically trapped atoms (with $\mu_c$ the chemical potential of the BEC in the trap, see H. Steck, M. Naraschewski and H. Wallis, "Physical Review Letters", 80, 1998), but all atoms are coupled (neglecting any differences in the scattering lengths of the hyperfine states of $^{87}$Rb). Therefore the maximum mw magnetic field sensitivity can reach a value of $5\cdot10^{-13}$ T. Notice that in both the mw sensitivity calculations, the static magnetic field $B_0$ has been assumed to be perfectly stable. The influence of fluctuations on $B_0$ is estimated in section "E: Microwave field sensitivity". In practical situations, the reachable microwave magnetic field sensitivity might be limited due to the stability of $B_0$.

In contrast to most other methods, this cold atoms field imaging method works in frequency space. Therefore it is possible to frequency-selectively detect the mw magnetic field distribution of a multi-tone signal. The transition frequencies $\omega_\gamma$ can be adjusted by changing the value of the homogeneous magnetic field $B_0$. Using values for $B_0$ of up to 0.5 T, which seems to be a realistic effort e.g. for prototype testing, values for $\omega_\gamma(B_0)$ can be tuned from 2.5 to 14 GHz for $^{87}$Rb (see section D of the Supplementary Information). Note that for $B_0>0.1$ T we start entering the Paschen-Back regime. Then the matrix elements of eqns. 1-3 are different and the presented theory has to be modified.

It is also possible to use a two-photon process (see M. R. Matthews et al. in "Phys. Rev. Lett." vol. 81, 1998, p. 243-247) where an auxiliary field e.g. a second mw or the combination of mw and RF fields at frequencies $\omega_1$ and $\omega_2$ (with $\omega_1+\omega_2+\omega_{1s}=\omega_\gamma$, where $\omega_{1s}$ denotes the level shift due to the off-resonant electro-magnetic fields) are shone upon the atoms. If one of the fields is homogeneous (or has a known distribution) then the field distribution of the second frequency is probed. This allows probing of frequencies from MHz to GHz without strong magnetic fields $B_0$. While using a two-photon process widens the accessible frequency range, it may lower the mw magnetic field sensitivity (see T. R. Gentile et al in "Phys. Rev. A" vol. 40, 1989, p. 5103-5115).

The inventive cold atoms field imaging method can be extended to measure 3D magnetic field distributions slice by slice by using a light sheet detection technique (see R. Bücker et al. "Single-atom-sensitive fluorescence imaging of ultracold quantum gases" in "arXiv 0907.0674v1", 2009) where slices perpendicular to the camera line of sight are illuminated, resonant with the F=2 manifold. By detecting the fluorescence of the atoms in state F=2, it is possible to detect the distribution of atoms in F=2 slice by slice.

An alternative to measure 3D magnetic field distributions could be by preparing sheets of atoms. This could be achieved by initializing the atoms in state $|2,2>$. Just before the mw pulse, atoms in thin sheet are optically pumped to state $|1,-1>$ (or alternatively to $|1,1>$ The atoms remaining in state $|2,2>$ are blown away using a laser pulse resonant with the transition F=2↔F'=3. What remains are the atoms F=1, which now undergo Rabi oscillations during $dt_{mw}$ in the mw magnetic field. The final distribution $p_2(r)$ can then be detected by standard absorption imaging.

2. Experimental Results

The mw magnetic near-field distribution of the CPW 102 of FIG. 1 is characterized with the following steps. Firstly, the spatial distribution of the different mw magnetic field components $B_-$, $B_\pi$ and $B_+$ for the quantization axis $B_0$ pointing along the x, y and z axis are measured. The mw frequency $\omega$ is tuned into resonance with the desired transition $\omega_\gamma$ by adjusting $\omega$, and keeping $B_0$ at a constant value. But if a device's characteristics at a certain frequency $\omega'$ is to be tested, one could get $\omega_\gamma$ into resonance with $\omega'$ by adjusting $B_0$. The mw magnetic field distribution is measured at a position where the mw CPW 102 is translational invariant along the imaging beam direction. An overview of the measured data is shown in FIG. 4.

Figure 4:
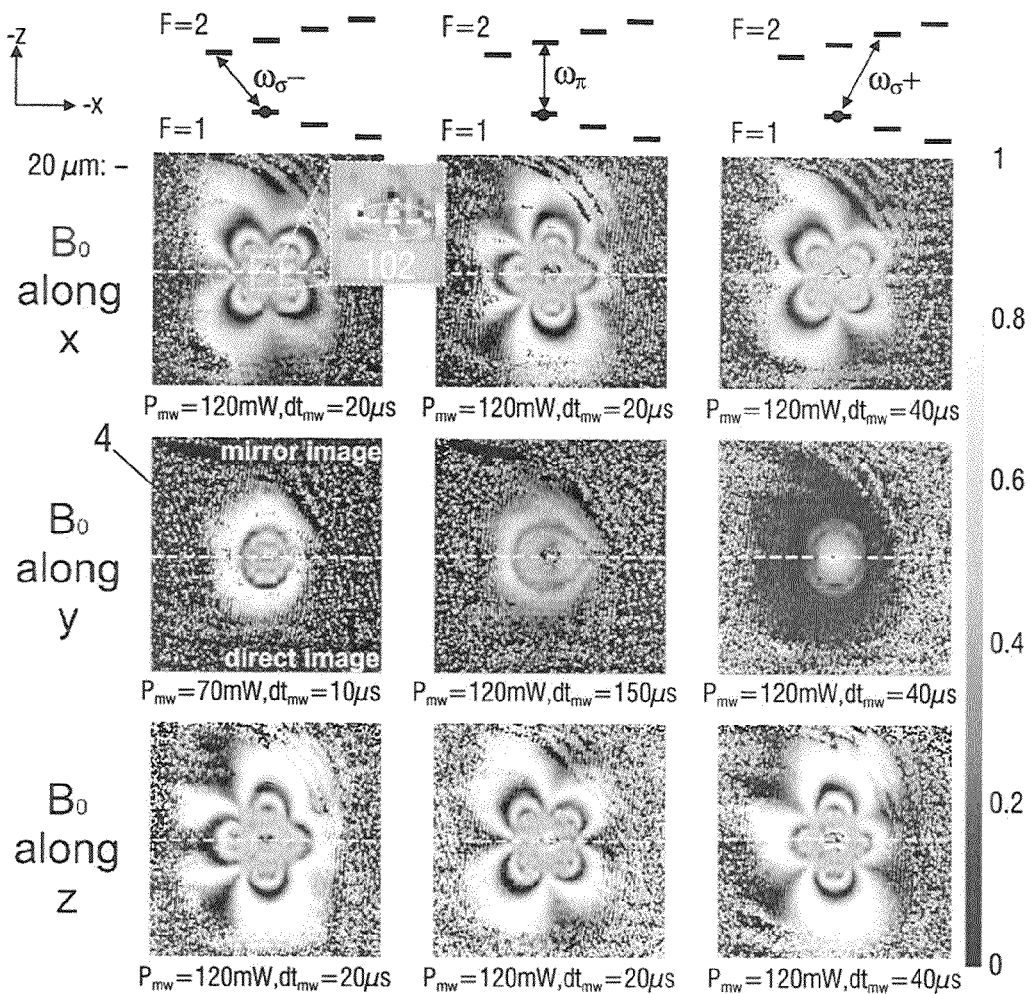
FIG. 4: an illustration of experimental results obtained with the inventive sensor device.

FIG. 4 illustrates the measurement of the different mw magnetic field polarization components around the mw coplanar waveguide 102. A mw at frequency $\omega = \omega_-$, $\omega_\pi$ or $\omega_+$ drives Rabi oscillations during $dt_{mw}$ for $B_0$ pointing along x, y or z. Shown are absorption state images of the atomic population in the F=2 manifold after the mw pulse, normalized by the total atom number distribution. This normalization procedure is the cause of the gray noise in the periphery of the images. Each image is the average of between 15 and 130 measurements. The size and the position of the CPW 102 are indicated in the inset in the upper left picture. Due to the beam geometry, the imaging beam is reflected at the atom chip surface at an angle of 2°. As a result, the direct image and its reflection on the atom chip are visible simultaneously on each of the pictures of FIG. 4. The dashed line separates the two. The mw power $P_{mw}$ launched into the coaxial cable leading to the mw coplanar waveguide 102 and the pulse duration $dt_{mw}$ are indicated below each picture.

What appears in FIG. 4 are essentially isopotential lines of the resonant mw magnetic field components. Qualitative conclusions can be drawn directly by looking at one set of images—e.g. the left/right asymmetry in the pictures of FIG. 4 reveals that there is an asymmetry in the mw currents on the CPW wires 104. This confirms the findings by P. Böhi et al. in "Nature Physics" (vol. 5, 2009, p. 592-597).

It is possible to automatically extract $B_\gamma(r)$ from a single image. From $p_2(r)$ we can calculate $|\Omega_\gamma(r)|$ using eq. (4) up to an offset $n\pi/dt_{mw}$, where n is an integer. The offset for each point can be calculated by a ray-tracing method, where rays are sent from the image periphery (where $|\Omega_\gamma(r)|dt_{mw} \lesssim \leq 1$) through the desired point to the center of the mw structure (where $|\Omega_{65}(r)|$ is maximal). n is given by the sum of the number of minima and maxima on $p_2(r)$ encountered on the ray.

Figure 5:
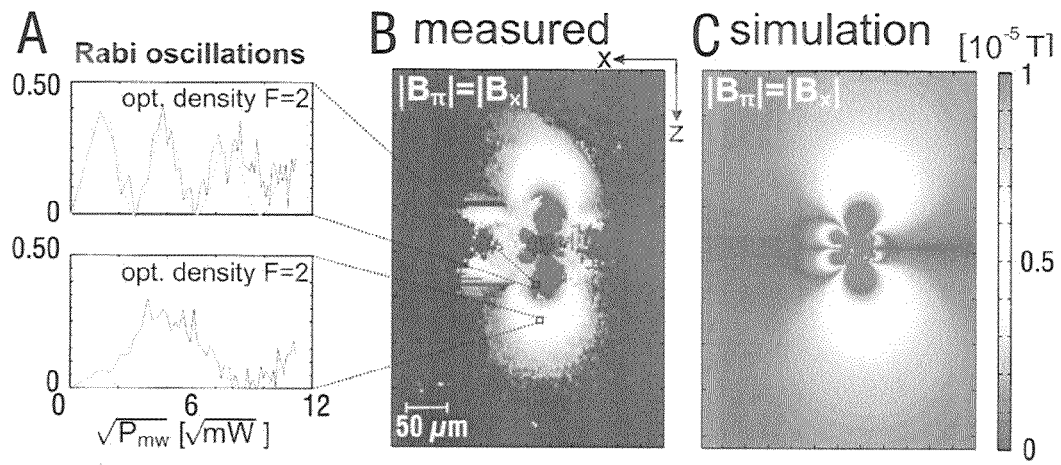
FIG. 5: an illustration of the extraction of a microwave magnetic field polarization component from series of state images.

Alternatively, we take series of k image frames, scanning either the mw power $P_{mw}$ or $dt_{mw}$ (the movie method). k depends on the desired dynamic range, but can be as low as 10. For each image pixel, we thus obtain a sequence of k data points showing Rabi oscillations, see FIG. 5. We fit a function $\propto$ $$\sin^2\left[\frac{1}{2}|\Omega_\gamma(P_{mw})|dt_{mw}\right]$$

to the data, where $|\Omega_\gamma(P_{mw})| = a\sqrt{P_{mw}}$ and a is the fit parameter. From the fit, we determine $|\Omega_\gamma|$ and thus, via Eqns. (1)-(3), $B_\gamma$ at this pixel for a given $P_{mw}$.

In an experiment of the inventors the time to record one frame is 14 s, but could be reduced to $\leq$3 s (see D. M. Farkas et al. in "arXiv:0912.0553", 2009). As an example, FIG. 5B shows an image of the Cartesian mw field component $B_x(r)$ near the CPW reconstructed using the movie method, for $P_{mw}=120$ mW and $dt_{mw}=20$ µs. Rabi oscillations at two exemplary pixels are shown in FIG. 5A. It has been found that the fits can be improved by adding an exponential decay to the fit function. The decay accounts for dephasing due to field gradients over the extent of the optical resolution. Comparing data and simulation, one obtains information about the current distribution on the CPW.

It can be found that the mw magnetic field distribution can best be understood as the result of asymmetries in the currents in the ground wires of the CPW of 10% plus induced currents in the two wires next to the waveguides grounds with amplitude of 2% of the CPW center wire current $I_s$.

Full reconstruction of the mw magnetic field distribution (including relative phases between the components) is possible using the reconstructed mw fields of the $B_\pi$, $B_+$ and $B_-$ polarization component for $B_0$ pointing along x, y and z (see Supplementary Information below). It is also possible to measure the spatial dependence of the absolute phase of the mw magnetic field. This is described in section C of the Supplementary Information.

3. Microwave Sensitivity for Free-Falling Atoms

The sensitivity of this cold atoms field imaging method, for the case of a free falling atom cloud, is mainly determined by the interaction time $dt_{mw}$ of the atoms with the mw pulse on the MMIC. A longer interaction time $dt_{mw}$ leads to higher mw magnetic field sensitivity, because then a weaker mw field can already drive a substantial fraction of a Rabi cycle. However, at the same time the effective spatial resolution $s_{eff}=2\sigma_{eff}$ decreases as the image blurs due to the movement of the atoms during $dt_{mw}$. In the following, the symbol $\sigma$ always refers to an r.m.s. width. $\sigma_{eff}$ is determined by the average moving distance $\sigma_{mw}$ of the atoms during the mw pulse, by the optical resolution of the imaging system $s_{opt}=2\sigma_{opt}$, and by the movement of the atoms during the imaging laser pulse, where thermal motion ($\sigma_{tm}$) and diffusive motion due to photon scattering ($\sigma_{ps}$) contribute. In the following, we will calculate $\sigma_{mw}$, $\sigma_{tm}$, $\sigma_{ps}$, and $\sigma_{eff}$.

3.1 Movement of the Atoms During the mw Pulse—$\sigma_{mw}$

A free-falling atom in a cloud at temperature T has a mean thermal velocity perpendicular to the line of sight of $$v_{th} = \sqrt{\frac{2k_B T}{m}}.$$

After releasing the atom from the trap and waiting for $dt_{ho}$, the atom has furthermore acquired a velocity $v_g = g \cdot dt_{ho}$ along the direction of gravity. During the interaction with the mw for a time $dt_{mw}$, the atom moves ballistically by an average distance $$\sigma_{mw} = g \cdot dt_{ho} \cdot dt_{mw} + \frac{1}{2} g \cdot dt_{mw}^2 + \sqrt{\frac{2k_B T}{m}} dt_{mw}$$

For T=5 µK, $dt_{ho}=0$, and $dt_{mw}=80$ µs we obtain $\sigma_{mw}=2.5$ µm. For short times, the last term in the equation above dominates (as it is the case for our parameters). The displacement of the atoms during the mw pulse can then be approximated by a Gaussian function $f_{mw}$ of r.m.s. width $\sigma_{mw}$.

3.2 Movement of Atoms During the Imaging Pulse—$\sigma_{tm}$

During the imaging pulse of duration $dt_{im}$, the atoms move ballistically by an average distance $\sigma_{tm}$ given by $$\sigma_{tm} = g(dt_{ho} + dt_{mw})dt_{im} + \frac{1}{2} \cdot g \cdot dt_{im}^2 + \sqrt{\frac{2k_B T}{m}} dt_{im}$$

due to gravity and thermal motion. For $dt_{im}=40$ µs we get $\sigma_{tm}=1.3$ µm. Again, for short times the atomic density distribution after the imaging pulse can be approximated by a Gaussian $f_{tm}$ with r.m.s. width $\sigma_{tm}$.

3.3 Diffusive Movement of Atoms Due to Photon Scattering—$\sigma_{ps}$

During the imaging laser pulse of duration $dt_{im}$, the atoms randomly scatter photons. The associated momentum recoils lead to a diffusive motion of the atoms, which leads at the end of the pulse to an average displacement perpendicular to the line of sight of $$\sigma_{ps} = \sqrt{\frac{2}{3}} \cdot \sqrt{\frac{N_p}{3}} \cdot v_{rec} \cdot dt_{im},$$

where $v_{rec}=\hbar k/m=5.9$ mm/s is the atomic recoil velocity for $^{87}$Rb, and $N_p$ the number of scattered photons, with $N_p=(\Gamma/2)dt_{im}s/(1+s)$ and the natural line width $\Gamma=2\pi\times 6.1$ MHz. For the experimental parameters (saturation parameter $s=I/I_{sat}=1$, $dt_{im}=40$ µs) we get $\sigma_{ps}=2.2$ µm.

3.4 Effective Spatial Resolution $s_{eff}=2\sigma_{ef}$

The effective resolution can be approximately be calculated by the convolution $f_{eff}=f_{opt}*[f_{ps}*(f_{tm}*f_{mw})]$, where $f_{opt}$ approximates the point spread function of the imaging system by a Gaussian $f_{opt}$ with $\sigma_{opt}=2$ µm. As a result, we get $\sigma_{eff}=4.1$ µm. We take as the effective resolution for our parameters $s_{eff}=2\sigma_{eff}=8.2$ µm.

3.5 Imagine Noise

The noise on the absorption images is important for the sensitivity of our technique. It determines the minimum number of atoms $N_{2,min}$ that has to be transferred by the mw into the F=2 manifold during $dt_{mw}$ in order for the mw field to be detectable. We currently use an Andor iKon-M camera with a quantum efficiency of 90% for absorption imaging @ 780 mn. The optical resolution of our imaging system is $s_{opt}=4$ µm, the imaging pulse duration $dt_{im}=40$ µs, and we are imaging at saturation intensity (s=1). With these parameters, we calculate an uncertainty in the number of atoms detected in an area of $A_{eff}=\pi\sigma_{eff}^2$ of 1.4 atoms r.m.s. We measure a value of $\sigma_{N,psn}=2.0$ atoms. The difference can be explained by interference fringes on the image. This additional noise could certainly be decreased further.

Quantum projection noise due to the probabilistic nature of the measurement process is an additional contribution of noise on the images. The measurement process projects the atomic superposition state onto the F=1 and F=2 states, resulting in a number of atoms of $N_1$ and $N_2$ in the two states, respectively. Even if the total number of atoms $N=N_1+N_2$ is the same in each shot, $N_1$ and $N_2$ will show (anticorrelated) fluctuations. This projection noise has an r.m.s. amplitude $\sigma_{N_1}=\sigma_{N_2}=\sqrt{N\cdot p_2 \cdot (1-p_2)}$, where $\sigma_{N_1}$ denotes noise in $N_1$ and $p_2=N_2/N$. The total noise on $N_2$ is thus $\sigma_{N,tot}=\sqrt{\sigma_{N,psn}^2+\sigma_{N_2}^2}$. We find that in order to obtain a signal-to-noise-ratio SNR=$N_2/\sigma_{N,tot}>1$, we have to have $N_2>N_{2,min}=3$.

3.6 Microwave Field Sensitivity

In the experiment described in the first embodiment, we trap about $N=9\times 10^3$ atoms in the magnetic trap. The trapping frequencies are $\omega_x=2\pi\times 27$ Hz and $\omega_y\approx\omega_z=\pi\times 680$ Hz. We calculate the average atomic density in the trap to $n=2.2\times 10^{11}$/cm$^3$. The trapped cloud has a radius of $$\rho = \sqrt{\frac{2k_B T}{m}}\frac{1}{\omega_y} = 7.2\,\mu m$$

along the y-axis, which is the direction of the imaging beam. If we image the atoms with $dt_{ho}=0$, we have about N=170 atoms inside a cylinder of radius $\sigma_{eff}$ and height $2\rho$. The mw magnetic field which transfers on average $N_{2,min}=3$ atoms to F=2 is obtained by requiring that $$N_2 = N\sin^2\left[\frac{1}{2}|\Omega_\gamma|dt_{mw}\right]^! = N_{2,min}. \quad (5)$$

For the three transitions $\omega=\omega_-$, $\omega=\omega_\pi$ and $\omega=\omega_+$, this is equivalent to $$N_{F=2} = N\sin^2\left[\frac{1}{2}\left(\frac{\mu_B}{\hbar}\sqrt{3}\,B_-\right)dt_{mw}\right] \approx N\left[\frac{1}{2}\left(\frac{\mu_B}{\hbar}\sqrt{3}\,B_-\right)dt_{mw}\right]^2 \stackrel{!}{=} 3,$$

$$N_{F=2} = N\sin^2\left[\frac{1}{2}\left(\frac{\mu_B}{\hbar}\sqrt{\frac{3}{4}}\,B_\pi\right)dt_{mw}\right] \approx N\left[\frac{1}{2}\left(\frac{\mu_B}{\hbar}\sqrt{\frac{3}{4}}\,B_\pi\right)dt_{mw}\right]^2 \stackrel{!}{=} 3,$$

$$N_{F=2} = N\sin^2\left[\frac{1}{2}\left(\frac{\mu_B}{\hbar}\sqrt{\frac{1}{2}}\,B_+\right)dt_{mw}\right] \approx N\left[\frac{1}{2}\left(\frac{\mu_B}{\hbar}\sqrt{\frac{1}{2}}\,B_+\right)dt_{mw}\right]^2 \stackrel{!}{=} 3,$$

Solving the above equations with $dt_{mw}=80$ µs, we get $B_-=2.2\cdot 10^{-8}$ T, $B_\pi=4.4\cdot 10^{-8}$ T, and $B_+=5.4\cdot 10^{-8}$ T.

Note that the projection noise $\sigma_{N2}$ slowly increases with increasing $N_2$. Therefore, the absolute mw field resolution of this method decreases with increasing values of B. The consideration above relies on the assumption that we can achieve perfect resonance $\omega=\omega_\gamma$. Solving eq. (5) for $N_{2,min}$, we obtain $|\Omega_\gamma|/2\pi=0.53$ kHz for $N_2=3$. A change in $\omega_\gamma/2\pi$ of 0.53 kHz corresponds to a magnetic field instability of $2.5\cdot 10^{-8}$ T for $\Omega_-$, $3.8\cdot 10^{-8}$ T for $\Omega_\pi$, and $7.6\cdot 10^{-8}$ T for $\Omega_+$. Inside the magnetic shielding surrounding our experiment, we achieve a stability of $B_0$ of $2\cdot 10^{-8}$ T r.m.s., which could certainly still be improved such that the effect can be neglected.

The sensitivity of our field imaging technique can be increased by using colder or denser clouds. Suitable techniques to reduce the temperature further are adiabatic relaxation of the trap or further forced evaporative cooling.

4. Supplementary Information

A) Rabi Oscillations

We derive the Rabi frequencies $\Omega_\gamma$ for the resonant coupling of ground state hyperfine levels of $^{87}$Rb with a mw field. In the following, we consider an atom in a weak static magnetic field $B_0$, so that the Zeeman splitting $\omega_L=\mu_B B_0/2h$ is small compared to the zero-field splitting of $\omega_0\cong 2\pi\times 6.8$ GHz between the two hyperfine manifolds F=1 and F=2 of the $5^2S_{1/2}$ electronic ground state of $^{87}$Rb. The atom is initially prepared in the hyperfine sublevel $|F,m_F\rangle=|1,-1\rangle$, and the mw frequency $\omega$ is resonant with one of the transitions $|1,-1\rangle \leftrightarrow |2,m_2\rangle$, ($m_2=-2,-1,0$) connecting to this level (see FIG. 2)

The real-valued mw magnetic field at position r=(x, y, z) in the fixed Cartesian laboratory coordinate system is $$\mathcal{B}(r, t) = \frac{1}{2}[B(r)e^{-i\omega t} + B^*(r)e^{i\omega t}] \qquad (5)$$

with the complex phasor $$B(r) \equiv \begin{pmatrix} B_x(r)e^{-i\phi_x(r)} \\ B_y(r)e^{-i\phi_y(r)} \\ B_z(r)e^{-i\phi_z(r)} \end{pmatrix}.$$

We have chosen $B_i$, $\Phi_i \in \mathfrak{R}_{\geq 0}$, (i=x, y, z).

In the following, we consider a fixed position in space and suppress the dependence of $B_i(r)$ and $\Phi_i(r)$ on r to simplify notation. In our experiment, we apply a homogeneous static magnetic field $B_0$ along several directions in order to be able to reconstruct all components of the mw magnetic field. For a given $B_0$, we choose a new Cartesian coordinate system (x', y', z') with the z'-axis pointing along $B_0$, which defines the quantization axis for the atomic states $|F, m_F\rangle$. In this new coordinate system, the mw magnetic field phasor is given by $$B(r) \equiv \begin{pmatrix} B_{x'}e^{-i\phi_{x'}} \\ B_{y'}e^{-i\phi_{y'}} \\ B_{z'}e^{-i\phi_{z'}} \end{pmatrix}.$$

The mw magnetic field couples to the magnetic moment of the electron of the atom. The coupling to the nuclear magnetic moment is neglected, because it is three orders of magnitude smaller than the electron magnetic moment. The Rabi frequency on the hyperfine transition $|1,-1\rangle \leftrightarrow |2,m_2\rangle$ is given by $$\Omega_{1,m_1}^{2,m_2} = \frac{2\mu_B}{\hbar}\langle 2, m_2|B\cdot J|1, m_1\rangle,$$

with $J=(J_{x'}, J_{y'}, J_{z'})$ the electron spin operator. Using $J_\pm = J_{x'} \pm iJ_{y'}$, we can write $$B \cdot J = B_{x'}e^{-i\phi_{x'}}J_{x'} + B_{y'}e^{-i\phi_{y'}}J_{y'} + B_{z'}e^{-i\phi_{z'}}J_{z'}$$
$$= \frac{1}{2}(B_{x'}e^{-i\phi_{x'}} - iB_{y'}e^{-i\phi_{y'}})J_+ +$$
$$\frac{1}{2}(B_{x'}e^{-i\phi_{x'}} + iB_{y'}e^{-i\phi_{y'}})J_- + B_{z'}e^{-i\phi_{z'}}J_{z'}$$

Evaluating the matrix elements for the three transitions connecting to $|1,-1\rangle$ (see P. Treutlein, Ph.D. thesis, published as MPQ report 321), we obtain the Rabi frequencies $$\Omega_- \equiv \Omega_{1,-1}^{2,-2} \qquad (5)$$
$$= \frac{2\mu_B}{\hbar}\langle 2,-2|\frac{1}{2}(B_{x'}e^{-i\phi_{x'}} + iB_{y'}e^{-i\phi_{y'}})J_-|1,-1\rangle$$
$$= -e^{-i\phi_-} \cdot \sqrt{3} \cdot \frac{\mu_B}{\hbar}B_-,$$

-continued $$\Omega_\pi \equiv \Omega_{1,-1}^{2,-1}$$
$$= \frac{2\mu_B}{\hbar}\langle 2,-1|\frac{1}{2}B_{z'}e^{-i\phi_{z'}}J_{z'}|1,-1\rangle$$
$$= -e^{-i\phi_\pi} \cdot \sqrt{\frac{3}{4}} \cdot \frac{\mu_B}{\hbar}B_\pi,$$

$$\Omega_+ \equiv \Omega_{1,-1}^{2,0}$$
$$= \frac{2\mu_B}{\hbar}\langle 2,0|\frac{1}{2}(B_{x'}e^{-i\phi_{x'}} - iB_{y'}e^{-i\phi_{y'}})J_+|1,-1\rangle$$
$$= -e^{-i\phi_+} \cdot \sqrt{\frac{1}{2}} \cdot \frac{\mu_B}{\hbar}B_+.$$

Here we have used the definitions $$B_- e^{-i\phi_-} := \frac{1}{2}(B_{x'}e^{-i\phi_{x'}} + iB_{y'}e^{-i\phi_{y'}}), \qquad (6)$$
$$B_\pi e^{-i\phi_\pi} := B_{z'}e^{-i\phi_{z'}},$$
$$B_+ e^{-i\phi_+} := \frac{1}{2}(B_{x'}e^{-i\phi_{x'}} - iB_{y'}e^{-i\phi_{y'}}).$$

with $B_\gamma$, $\Phi_\gamma \in \mathfrak{R}_{\geq 0}$ ($\gamma = -, \pi, +$). We note that $\Omega_\pi$ is proportional to the projection of B onto $B_0$, while $\Omega_{+(-)}$ is proportional to the right (left) handed circular polarization component of B in the plane perpendicular to $B_0$.

In the experiment, we choose a sufficiently strong static field so that $\omega_1 \gg \Omega_\gamma$. Furthermore, we choose the mw frequency resonant with one of the transitions, $\omega = \omega_\gamma$. In this way, Rabi oscillations are induced only on the resonant transition in a given run of the experiment, which allows us to selectively image the individual mw magnetic field components $B_\gamma$.

B) Reconstruction of the Microwave Magnetic Field

The amplitudes $B_x$, $B_y$, and $B_z$ of the Cartesian components of B in laboratory coordinates can be easily determined by measuring $|\Omega_\pi|$ with the quantization axis $B_0/B_0$ pointing along x, y, and z, respectively. The extraction of the field components from absorption images is described in the main text. In the following, the upper index indicates the direction of the quantization axis in laboratory coordinates, e.g. $\Omega_-^y$ ($B_-^y$) means $\Omega_-(B_-)$ for $B_0$ pointing along the y-axis.

To reconstruct the relative phases $(\Phi_y - \Phi_x)$ and $(\Phi_z - \Phi_x)$ between the Cartesian components of B, we also measure the amplitudes of the circularly polarized components $B_+^x$, $B_-^x$, $B_+^y$, $B_-^y$, $B_+^z$ and $B_-^z$. Having measured these components, we can reconstruct the relative phases according to the following recipe.

$B_0$ along x

We choose a new coordinate system with z' along x, resulting from the following coordinate transformation:

$x' = -z$ $y' = y$ $z' = x$

In this rotated coordinate system, the mw magnetic field phasor reads $$B \equiv \begin{pmatrix} B_{x'} e^{-i\phi_{x'}} \\ B_{y'} e^{-i\phi_{y'}} \\ B_{z'} e^{-i\phi_{z'}} \end{pmatrix} = \begin{pmatrix} B_{z'} e^{-i\phi_{z'}} \\ B_{y'} e^{-i\phi_{y'}} \\ B_{x'} e^{-i\phi_{z'}} \end{pmatrix}.$$

From this we obtain:

$$B_{x'} = B_z \quad \Phi_{x'} = \Phi_z + \pi$$

$$B_{y'} = B_y \quad \Phi_{y'} = \Phi_y$$

$$B_{z'} = B_x \quad \Phi_{z'} = \Phi_x$$

Using eqns. 6, we calculate $$B_+^2 - B_-^2 = -B_{x'} B_{y'} \sin(\Phi_{y'} - \Phi_{x'}).$$

By insertion of the coordinate transformation and using eqns. 5 we get $$\sin(\phi_x - \phi_y) = \frac{\hbar}{4\mu_B^2 B_z B_y} \left(\frac{4}{3}|\Omega_-^x|^2 - 8|\Omega_+^x|^2\right) \quad (7)$$

$$= \frac{1}{\hbar B_y B_z}((B_-^x)^2 - (B_+^x)^2).$$

$B_0$ along y
A similar calculation as before yields $$\sin(\phi_x - \phi_z) = \frac{\hbar}{4\mu_B^2 B_z B_x} \left(\frac{4}{3}|\Omega_-^y|^2 - 8|\Omega_+^y|^2\right) \quad (8)$$

$$= \frac{1}{\hbar B_x B_z}((B_-^y)^2 - (B_+^y)^2).$$

$B_0$ along z
In this case, we obtain $$\sin(\phi_y - \phi_z) = \frac{\hbar}{4\mu_B^2 B_x B_y} \left(\frac{4}{3}|\Omega_-^z| - 8|\Omega_+^z|^2\right) \quad (9)$$

$$= \frac{1}{\hbar B_x B_y}((B_-^z)^2 - (B_+^z)^2)$$

All the quantities on the right hand sides of eqns. 7-9 can be measured.

Out of eqns. 7-9 the relative phases $(\Phi_y - \Phi_x)$ and $(\Phi_z - \Phi_x)$ can be calculated. The solution is unique except for the very degenerate case where $\sin(\Phi_x - \Phi_z) = \sin(\Phi_y - \Phi_x) = \sin(\Phi_z - \Phi_y) = 0$. In this case, there are 4 solutions which can not be distinguished.

C) Reconstruction of the Absolute Microwave Phase

While section B describes the reconstruction of the relative mw phases $(\Phi_y - \Phi_x)$ and $(\Phi_z - \Phi_x)$, between the Cartesian components of B, it is also possible to reconstruct the spatial dependence of the global phase of B. The procedure uses two mw pulses. During the whole sequence, $B_0$ stays the same. In the following, we assume $B_0$ is pointing along the x-axis, so that $\Phi_x(r)$ is measured. The other two phases, $\Phi_y(r)$ and $\Phi_z(r)$, can then be determined from the already known relative phases.

After releasing the atoms from the trap, they are prepared in an equal superposition of states |1,−1> and |2,−1> by application of a $$\frac{\pi}{2}$$

pulse at frequency $\omega = \omega_\pi$. This mw pulse is applied from a well-characterized source, so that it has negligible (or at least known) intensity gradients and negligible (or known) phase gradients across the atomic cloud. This can be achieved by using an external mw horn (see P. Böhi et al. in "Nature Physics" vol. 5, 2009, p. 592-597). The duration of the pulse is $$dt_{mw1} = \frac{\pi}{2|\Omega_{\pi,1}|},$$

where $\Omega_{\pi,1} = |\Omega_{\pi,1}| e^{i\Phi_{\pi,1}}$ is the Rabi frequency for the pulse. The state after this preparation pulse is (in the rotating wave approximation, see M. O. Scully, and M. S. Zubairy in "Quantum Optics", Cambridge University Press, Cambridge U.K., 1997)

$$|\psi_1\rangle = \frac{1}{\sqrt{2}}(|1,-1\rangle + ie^{-i\phi_{\pi,1}}|2,-1\rangle).$$

Immediately after the end of this preparation pulse, the mw in the MMIC to be characterized is pulsed on at frequency $\omega_2 = \omega_\pi$ for a duration $dt_{mw,2}$. The Rabi frequency and phase of this second mw pulse are denoted by $\Omega_{\pi,2}(r)$ and $\Phi_{\pi,2}(r)$, respectively. After the second pulse, the state of an atom at position r is $$|\psi_2(r)\rangle =$$

$$\frac{1}{\sqrt{2}}\left[\cos\left(\frac{|\Omega_{\pi,2}(r)|dt_{mw,2}}{2}\right) - e^{i\phi_{\pi,2}-i\phi_{\pi,1}}\sin\left(\frac{|\Omega_{\pi,2}(r)|dt_{mw,2}}{2}\right)\right]|1,-1\rangle +$$

$$\frac{1}{\sqrt{2}}\left[ie^{-i\phi_{\pi,1}}\cos\left(\frac{|\Omega_{\pi,2}(r)|dt_{mw,2}}{2}\right) + ie^{-i\phi_{\pi,2}}\sin\left(\frac{|\Omega_{\pi,2}(r)|dt_{mw,2}}{2}\right)\right]|2,-1\rangle.$$

The probability $p_2(r)$ of finding an atom at position r in state F=2 is then given by $$p_2(r) = \frac{1}{2} + \frac{1}{2}\sin(|\Omega_{\pi,2}(r)|dt_{mw,2}) \cdot \cos(\phi_{\pi,1} - \phi_{\pi,2}(r))$$

To calculate $\Phi_{\pi,2}(r)$, the quantities $|\Omega_{\pi,2}(r)|$ and $\Phi_{\pi,1}$ have to be known. $|\Omega_{\pi,2}(r)|$ can be measured as described before. If $B_0$ is pointing along the x-axis, then $\Phi_x(r) \equiv \Phi_{\pi,2}(r)$.

The calculation above assumes that there is zero delay between the end of the first preparation pulse and the second pulse in the MMIC. A similar calculation is also possible for non-zero delay between the two pulses.

D) Tunability of Transition Frequencies $\omega_-$, $\omega_\pi$ and $\omega_+$
[87]Rubidium Atoms The transition frequencies $\omega_-$, $\omega_\pi$ and $\omega_+$ between the initial state |1,−1> and the target states |2,−2>, |2,−1>, and |2,0>, respectively, can be adjusted by a change of the static magnetic field $B_0$. For small magnetic fields (i.e. $\omega_L \ll 2\pi \times 6.8$ GHz) the transition frequencies are approximately given by $\omega_- = \omega_0 - 3\omega_L$, $\omega_{\pi=\omega 0} - 2\omega_L$, and $\omega_+ = \omega_0 - \omega_L$, where $\omega_0 = 2\pi \times 6834.682610$ MHz and $\omega_0 = \mu_B B_0/2h$.

For larger values of $B_0$ a more accurate calculation is required. The $5^2S_{1/2}$ ground state hyperfine structure of $^{87}$Rb is described by the Hamiltonian $$H = A_{hfs} I \cdot J + \mu_B B_0 (g_J J_z + g_I I_z),$$

Figure 6:
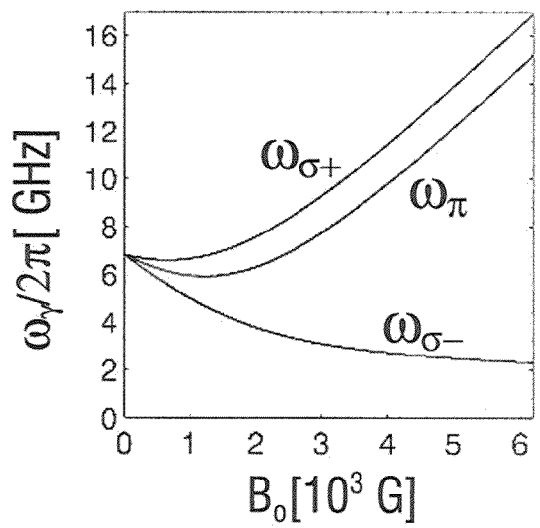
FIG. 6: an illustration of the tuneability of transition frequencies for $^{87}$Rb as a function of the value of the static magnetic field $B_0$.

With I the nuclear magnetic spin operator and J the operator for the total electronic spin, $A_{hfs} = \hbar \omega_0/2$, $g_I = -0.000995141$ and $g_J = 2.002331$. Even though $g_I/g_J \approx 10^{-3}$, the coupling of I to the magnetic field becomes important for large values of $B_0$. An analytical formula exists for the ground state manifold of a D transition (as it is the case for the states of interest), the Breit-Rabi formula:

$$E_{F,m_F} = -\frac{A_{hfs}}{(2I+1)} + g_I \mu_B m_F B \pm A_{hfs} \left(1 + \frac{4m_F \beta}{2I+1} + \beta^2\right)^{\frac{1}{2}}, \quad (10)$$

where $\beta = [(g_J - g_I)\mu_B B_0]/2A_{hfs}$, $m_F = m_I \pm m_J$ (the $\pm$ sign is the same as in eq. 10). The resulting transition frequencies $\omega_{\sigma-}$, $\omega_\pi$ and $\omega_{\sigma+}$ as a function of $B_0$ are illustrated in FIG. 6, wherein the individual transition frequencies can be tuned by up to 10 GHz upon using magnetic fields up to 0.5 T.

Other Atomic Species

By using atomic species other than $^{87}$Rb, different frequency ranges become accessible, e.g. 9.2 GHz for Cs or 1.7 GHz for Na.

E) Interferometry and Off-Resonant Probing

Instead of having $\omega$ resonant with a hyperfine transition frequency, it is also possible to probe an off-resonant mw or light-field (or anything else that causes a differential energy shift between the involved hyperfine levels) using a scheme based on Ramsey interferometry (see N. F. Ramsey, "Molecular Beams", Clarendon Press, Oxford, 1956).

In Ramsey interferometry, the interaction with the mw field of duration $T_{int}$ is enclosed by two $\pi/2$-pulses. The first pulse prepares the atoms in an equal superposition of two hyperfine states such as $$|\psi_1\rangle(t=0) = \frac{1}{\sqrt{2}}(|1,-1\rangle + ie^{-i\phi_{mw}}|2,m_2\rangle).$$

During time $T_{int}$ both states accumulate a differential phase $$\Delta \phi = \int_0^{T_{diff}} \frac{E_{diff}}{\hbar} dt \cdot E_{diff}$$

is the differential potential between the involved hyperfine levels and is in general state dependent. The state after this interaction is $$|\psi_1\rangle(t=T_{int}) = \frac{1}{\sqrt{2}}(|1,-1\rangle + ie^{-i\Delta\phi - i\phi_{mw}}|2,m_2\rangle).$$

Applying the second $\pi/2$-pulse, the state becomes $$|\psi_2\rangle = \frac{1}{2}[(1-e^{-i\Delta\phi})|1,-1\rangle + ie^{-i\phi_{mw}}(e^{-i\Delta\phi}+1)|2,m_2\rangle],$$

where $\Phi_{mw}$ is the phase of the resonant mw in frame rotating at the atomic transition frequency, neglecting any mw level shifts. The probability of detecting an atom in state $|1,-1\rangle$ and $|2,m_2\rangle$ is then given by $$p_1(r) = \frac{1}{2}(1 - \cos(\Delta\phi)).$$

$$p_2(r) = 1 - p_1(r) = \frac{1}{2}(1 + \cos(\Delta\phi)).$$

By measuring the relative populations $p_1(r)$ and $p_2(r)$ after the second $\pi/2$ pulse, it is possible to determine the value of $\Delta\Phi$ and thereby $E_{diff}$. Details on the effect of an off-resonant mw field are discussed by P. Treutlein, in "Phys. Rev. A" vol. 74, 2006, p. 022312.

5. Microwave Field Sensor Device

Figure 7:
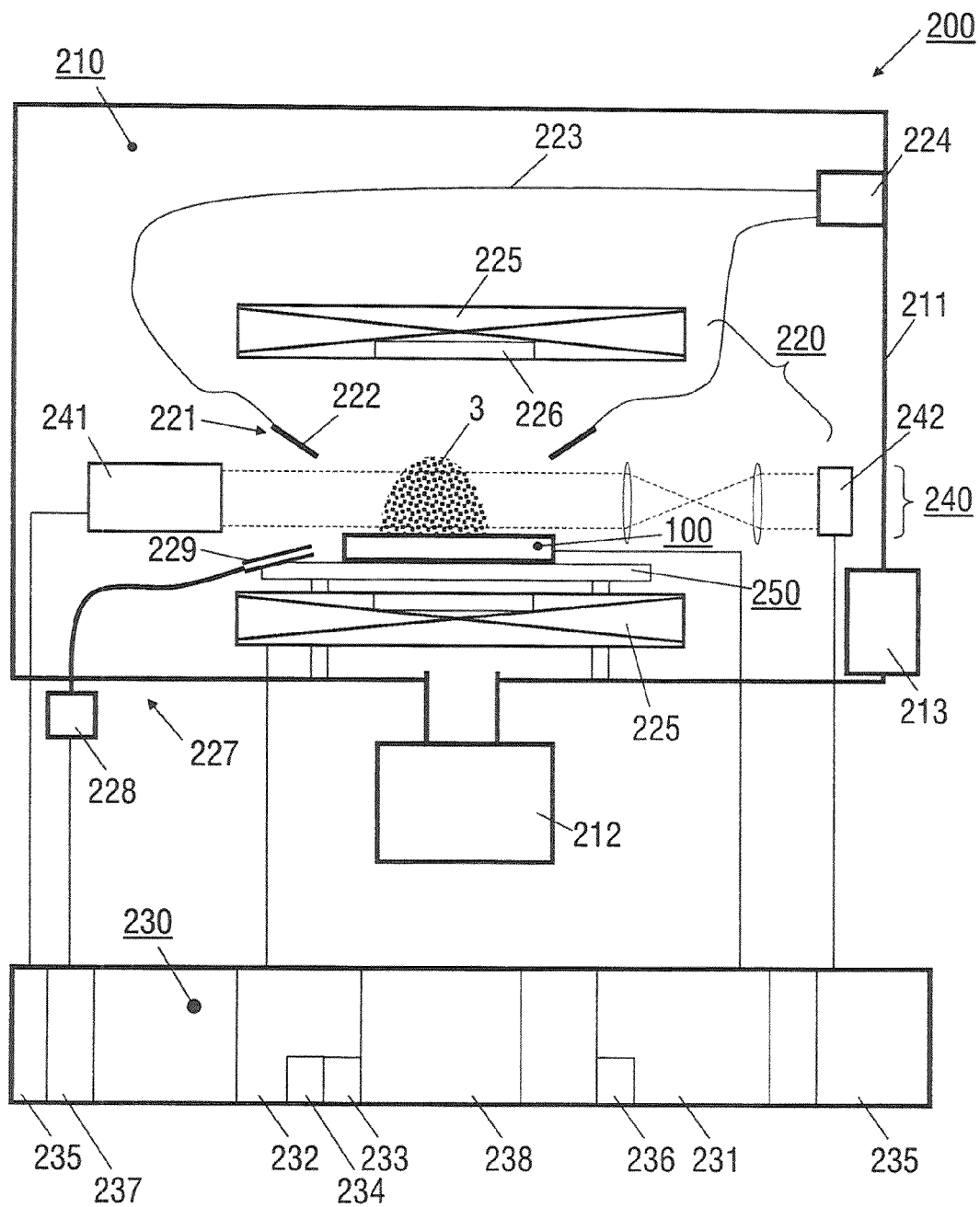
FIGS. 7 and 8: schematic sectional views of embodiments of the sensor device according to the invention.
Figure 8:
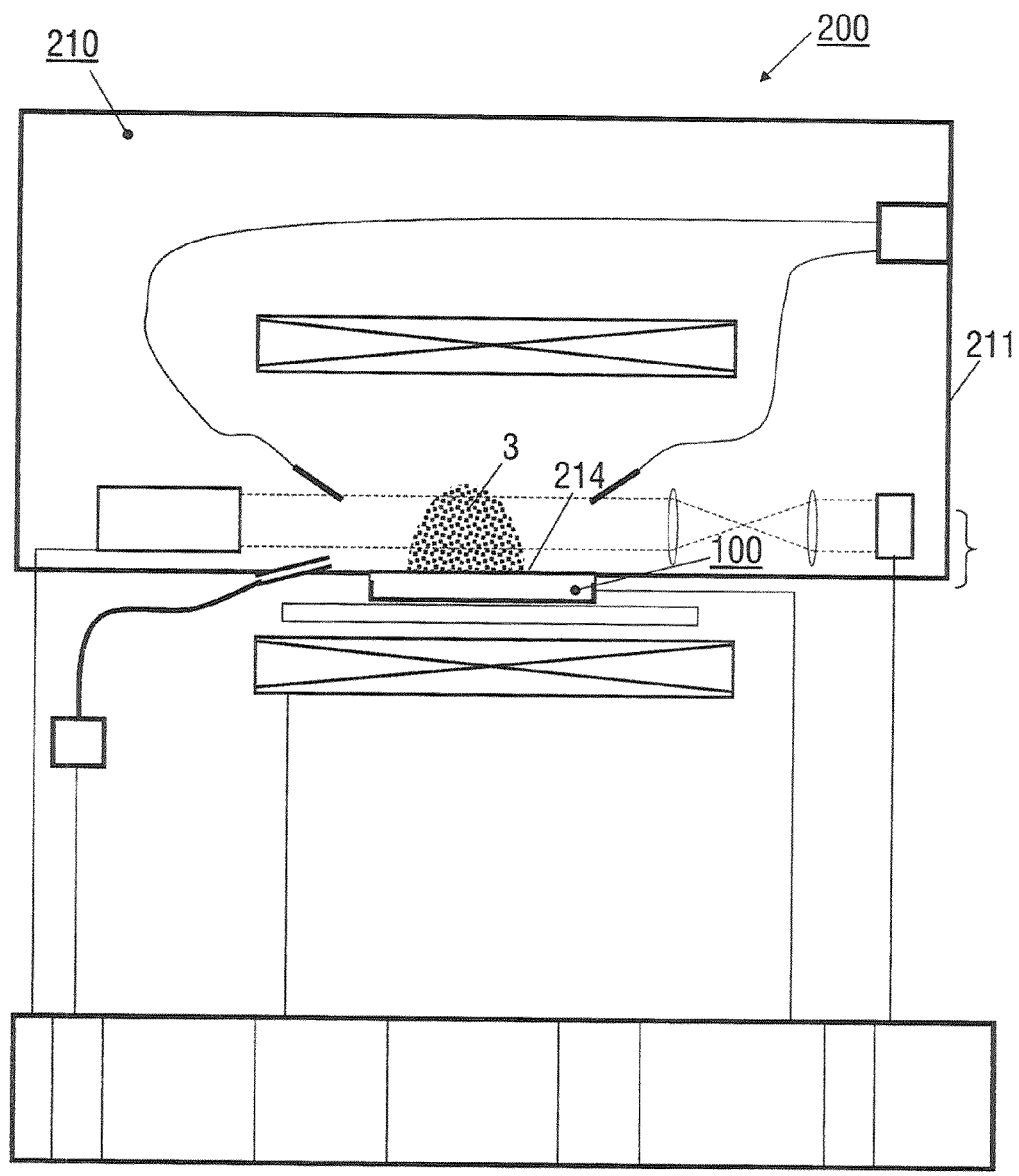

Preferred embodiments of the inventive mw field sensor device 200 are illustrated in FIGS. 7 and 8. It is emphasized that FIGS. 7 and 8 represent schematical illustrations showing the main components of the sensor device. With practical implementations, the sensor device can be adapted according to the particular requirements of the application. The illustrated sensor devices 200 are capable of implementing the mw field sensing method according to both of the first and second embodiments described above.

According to FIG. 7, the sensor device 200 comprises a vacuum chamber 210, an atom cloud preparation device 220, a control device 230, an imaging device 240 and a carrier device 250 being arranged for accommodating a mw device 100 under examination.

The vacuum chamber 210 comprises a recipient 211 and a vacuum pump 212 as it is known from conventional vacuum technique. The vacuum chamber is arranged for providing an environment of reduced pressure, in particular a pressure below $10^{-5}$ mbar, particularly preferred below $10^{-8}$ mbar. As the embodiment of FIG. 7 is adapted for measuring the mw field with the new device 100 arranged in the environment of reduced pressure, the vacuum chamber 210 further comprises a locking device 213 through which the mw device 100 can be introduced into the vacuum chamber 210.

The atom cloud preparation device 220 comprises a cooling device 221, a magnetic field device 225 and an atom trap device 226. For illustrative purposes, the cooling device 221 is shown as a laser cooling device comprising a plurality of irradiation units 222. The irradiation units 222 are connected via optical fibers 223 and an optical coupler 224 with an external light source, like a laser source (not shown). Construction and operation of the cooling device 221 is provided as it is known from conventional laser cooling of ultracold atoms. Alternatively or additionally, further cooling techniques can be applied, e.g. with an evaporative cooling device or a cryogenic cooling device.

The magnetic field device 225 is adapted for generating a static magnetic field in the vacuum chamber 210. For illustrative purposes, the magnetic field device 225 is illustrated with two coils only. In practice, the magnetic field device 225 has a more complex structure. Optionally, the magnetic field device 225 can be adapted for adjusting the direction of the static magnetic field and/or providing a field gradient.

If the atom cloud 3 of ultracold probe atoms is to be prepared and/or confined using an atom trap, the magnetic field device 225 is further provided with the atom trap device 226 for generating the atom trap (magnetic trap). Additionally or alternatively, further techniques for generating an atom trap can be implemented, which are conventionally known for manipulating ultracold atoms.

The atom cloud preparation device 220 includes an atom source 227 comprising an atom reservoir 228 and a tubing 229. The atom source 227 is adapted for delivering probe atoms, e. g. $^{87}$Rb atoms into the vacuum chamber, in particular into the region of investigation 6 over the microwave device 100.

The control device 230 has a main function of driving the mw device 100 under examination. The control device 230 is arranged with an interface for connecting the mw device 100 with a mw control 231 included in the control device 230. The mw control 231 includes a power source being adapted for applying mw pulses, in particular pulse-shaped driving currents with predetermined amplitudes, phases and frequencies, to the mw device 100.

Further functions of the control device 230 are optionally implemented depending on the application of the invention. Preferably, the control device 230 includes a magnetic field control 232 being arranged for adjusting the static magnetic field and optionally the magnetic trap holding the atom cloud 3. The magnetic field control 232 can include an atom trap control 233 for controlling the atom trap device 226 and/or an adjustment device 234 which is adapted for adjusting at least one of a magnetic field gradient and/or an optical field (not shown) such that resonant hyperfine levels of the probe atoms in the atom cloud 3 are provided in a predetermined restricted region of investigation. Furthermore, the control device 230 may be arranged for controlling the imaging device 240. To this end, an imaging control 235 is provided which is connected with components of the imaging device 240.

Additionally, the mw control 231 includes a pulse delay control 236, which is adapted for controlling the time of application of the mw pulse with the mw device relative to a characteristic time of manipulating the atom cloud 3, e.g. relative to the time of opening the atom trap for expanding the atom cloud 3. To this end, the pulse delay control 236 is connected with both the atom trap control 233 and the mw field control 231.

Optionally, the atom reservoir 228 can be connected with an atom source control 237 included in the control device 230. The atom source control 238 is arranged for controlling the supply of probe atoms into the vacuum chamber 210.

Finally, the control device 230 includes a processor circuit 238 which is arranged for extracting the at least one mw magnetic field polarization component or the mw magnetic field distribution from the state image(s) collected with the imaging device. The processor circuit 238 is connected with further data processing units, e. g. for storing, displaying or recording state image(s), mw magnetic field polarization component(s) and/or amplitudes or phases thereof.

The imaging device 240 comprises a light source 241, like e.g. a laser source with an irradiation optic providing a collimated laser beam. Furthermore, the imaging device 240 comprises a camera device 242 being arranged for collecting an image of the atom cloud 3 irradiated with the light source 241. The light source 241 and the camera device 242 are arranged such that an imaging light path is directed through the atom cloud 3, preferably in parallel to a surface of the mw device 100.

The carrier device 250 comprises a platform or table carrying the mw device 100. Optionally, a drive unit (not shown) can be provided for translating the carrier device 250 relative to the remaining parts of the sensor device 200, in particular relative to the atom cloud 3.

FIG. 8 illustrates an alternative embodiment of the inventive sensor device 200, which is adapted for arranging the mw device 100 in an environment of ambient or reduced pressure, while the atom cloud 3 of probe atoms is manipulated in the vacuum chamber 210 with even lower pressure. With this embodiment, the recipient 211 includes a shielding window 214 separating the environments with differential pressures. The shielding window 214 is capable of transmitting the mw field of the mw device 100. It comprises e.g. a SiN membrane, having a thickness of down to 0.05 μm. The remaining components of the sensor device 200 of FIG. 8 can be structured as described above with reference to FIG. 7.

The features of the invention disclosed in the above description, the drawings and the claims can be of significance both individually as well as in combination for the realisation of the invention in its various embodiments.

The invention claimed is:

1. A method for sensing a microwave magnetic field polarization component of a microwave field generated by a microwave device, comprising the steps of:
    generating a static magnetic field having a predetermined amplitude and a predetermined direction relative to the microwave magnetic field polarization component to be sensed,
    preparing an atom cloud of ultracold probe atoms in defined hyperfine levels, wherein the hyperfine levels of the probe atoms are split in transition frequencies by the static magnetic field,
    applying a microwave pulse including the microwave magnetic field polarization component to be sensed to the atom cloud, wherein a spatial state distribution of the probe atoms is created by Rabi oscillations during the microwave pulse between the hyperfine levels of the probe atoms being resonant with the microwave magnetic field polarization component, and
    collecting a state image of the probe atoms, said state image depending on the spatial state distribution of the probe atoms and representing the magnetic field polarization component to be sensed.

2. A method according to claim 1, wherein
the preparing of the atom cloud includes the steps of providing the probe atoms in an atom trap and expanding the atom cloud, and
the state image represents a distribution of the microwave magnetic field polarization component in a space covered by the expanded atom cloud.

3. A method according to claim 2, wherein
the expansion of the atom cloud is obtained by opening the atom trap in at least one spatial direction, by at least one of a thermal expansion of the atom cloud and a mean-field repulsion expansion of the atom cloud.

4. A method according to claim 2, wherein
the microwave pulse is applied with a predetermined delay time after opening the atom trap.

5. A method according to claim 2, wherein
an anisotropic expansion of the atom cloud is provided by an anisotropic atom trap or by an anisotropic adjustment of the atom trap.

6. A method according to claim 1, wherein
the step of preparing the atom cloud includes confining the probe atoms in a spatially restricted region of investigation.

7. A method according to claim 6, wherein.
the state image represents the averaged microwave magnetic field polarization component in the region of investigation.

8. A method according to claim 6, wherein
the step of preparing the atom cloud includes at least one of spatially restricted adjusting the resonant hyperfine levels using at least one of a magnetic field gradient and an optical field, and trapping the atom cloud in an atom trap.

9. A method according to claim 6, wherein
the steps of preparing the atom cloud, applying the microwave pulse and collecting the state image are sequentially repeated in a plurality of regions of investigation.

10. A method according to claim 9, including the step of moving the atom cloud and the microwave device relative to each other before repeating at least one of the preparing, applying and collecting steps or during the preparing steps.

11. A method according to claim 8, wherein
multiple atom traps are generated simultaneously in the static magnetic field, and
the steps of preparing the atom cloud, applying the microwave pulse and collecting the state image are simultaneously conducted in all atom traps so that a plurality of microwave magnetic field polarization components at multiple locations of the microwave field are sensed simultaneously.

12. A method according to claim 1, wherein
the steps of preparing the atom cloud, applying the microwave pulse and collecting the state image are sequentially repeated with a plurality of microwave pulse parameters, in particular pulse power and duration, resulting in a plurality of state images.

13. A method according to claim 1, comprising at least one of the steps of
matching the resonant hyperfine levels to a predetermined frequency of the microwave field to be sensed by setting the static magnetic field,
matching the resonant hyperfine states at a predetermined static magnetic field by adjusting the microwave frequency to be sensed, and
selecting a type of the probe atoms in dependency on a predetermined frequency range of the microwave field to be sensed.

14. A method according to claim 1, wherein
at least one additional microwave or radio-frequency auxiliary field is applied to the atoms in order to drive multi-photon Raman transitions.

15. A method according to claim 1, wherein
the steps of generating a static magnetic field, preparing the atom cloud, applying the microwave pulse and collecting the state image are sequentially repeated with at least one of varying directions of the static magnetic field and varying hyperfine levels being resonant so that multiple microwave magnetic field polarization components are sensed.

16. A method according to claim 15, comprising at least one of the steps of:
extracting amplitudes of the magnetic field components of the microwave field from the multiple microwave magnetic field polarization components, and
extracting relative phases of the magnetic field polarization components of the microwave field from the multiple microwave magnetic field polarization components.

17. A method according to claim 16, wherein
a Ramsey interferometer sequence is used to measure at least one of a differential potential between different hyperfine levels, in particular an off-resonant microwave field or light field, and an absolute microwave component phase distribution.

18. A method according to claim 1, wherein the microwave device is arranged
in a vacuum environment where the atom cloud is prepared, or
in an environment of ambient, in particular atmospheric pressure being separated from a vacuum environment of the atom cloud by a shielding window.

19. A method according to claim 1, wherein
the step of collecting the state image of the atom cloud comprises collecting an absorption image or a fluorescence image.

20. A method according to claim 1, wherein
the microwave device comprises a MMIC, a RFIC, a high-frequency circuit, a microwave component or an antenna device.

* * * * *

UNITED STATES PATENT AND TRADEMARK OFFICE
CERTIFICATE OF CORRECTION

PATENT NO. : 8,310,230 B2
APPLICATION NO. : 12/729812
DATED : November 13, 2012
INVENTOR(S) : Haensch et al.

It is certified that error appears in the above-identified patent and that said Letters Patent is hereby corrected as shown below:

<u>On the Title Page</u>

At (73), please correct the Assignee name from "Ludwig-Maximillians-Universität München" to -- Ludwig-Maximilians-Universität München --.

Signed and Sealed this
Fifth Day of February, 2013

Teresa Stanek Rea
*Acting Director of the United States Patent and Trademark Office*